(12) United States Patent
Troyer et al.

(10) Patent No.: US 11,694,103 B2
(45) Date of Patent: Jul. 4, 2023

(54) QUANTUM-WALK-BASED ALGORITHM FOR CLASSICAL OPTIMIZATION PROBLEMS

(71) Applicant: Microsoft Technology Licensing, LLC, Redmond, WA (US)

(72) Inventors: Matthias Troyer, Clyde Hill, WA (US); David Poulin, Sherbrooke (CA); Bettina Heim, Redmond, WA (US); Jessica Lemieux, Sherbrooke (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 895 days.

(21) Appl. No.: 16/530,916

(22) Filed: Aug. 2, 2019

(65) Prior Publication Data

US 2020/0090072 A1    Mar. 19, 2020

Related U.S. Application Data

(60) Provisional application No. 62/733,608, filed on Sep. 19, 2018, provisional application No. 62/865,300, filed on Jun. 23, 2019.

(51) Int. Cl.
*G06N 10/00* (2022.01)
*G06F 30/20* (2020.01)
*G06F 18/20* (2023.01)

(52) U.S. Cl.
CPC .......... *G06N 10/00* (2019.01); *G06F 18/295* (2023.01); *G06F 30/20* (2020.01)

(58) Field of Classification Search
CPC .... G06N 10/00; G06N 3/0445; G06N 3/0472; G06N 5/003; G06N 3/044; G06N 3/047; G06N 5/01; G06F 30/00; G06F 30/20; G06F 18/295; G06K 9/6297
USPC ....................................... 706/62; 703/21, 13
See application file for complete search history.

(56) References Cited

PUBLICATIONS

Reitzner, Daniel et al., "Quantum Walks", Jul. 12, 2012. (Year: 2012).*
Chiang, Chen Fu, "The Power of Quantum Walk Insight, Implementation, and Applications", 2011, Electronic Theses and Dissertations, University of Central Florida. (Year: 2011).*

(Continued)

*Primary Examiner* — Cedric Johnson
(74) *Attorney, Agent, or Firm* — Klarquist Sparkman, LLP

(57) ABSTRACT

Example circuit implementations of Szegedy's quantization of the Metropolis-Hastings walk are presented. In certain disclosed embodiments, a quantum walk procedure of a Markov chain Monte Carlo simulation is implemented in which a quantum move register is reset at every step in the quantum walk. In further embodiments, a quantum walk procedure of a Markov chain Monte Carlo simulation is implemented in which an underlying classical walk is obtained using a Metropolis-Hastings rotation or a Glauber dynamics rotation. In some embodiments, a quantum walk procedure is performed in the quantum computing device to implement a Markov Chain Monte Carlo method; during the quantum walk procedure, an intermediate measurement is obtained; and a rewinding procedure of one or more but not all steps of the quantum walk procedure is performed if the intermediate measurement produces an incorrect outcome.

7 Claims, 9 Drawing Sheets

(56) References Cited

PUBLICATIONS

Kendon, Vivien M., "A Random Walk Approach to Quantum Algorithms", Dec. 15, 2006, Philosophical Transactions: Mathematical, Physical and Engineering Sciences, The Royal Society. (Year: 2006).*

Temme, K. et al., "Quantum Metropolis Sampling", Mar. 3, 2011, vol. 471, MacMillan Publishers. (Year: 2011).*

Aharonov et al., "Adiabatic Quantum State Generation and Statistical Zero Knowledge," *ACM Symp. on Theory of Computing*, pp. 20-29 (Jun. 2003).

Boixo et al., "Fast quantum algorithms for traversing paths of eigenstates," arXiv:1005.3034v1, pp. 1-36 (May 2010).

Farhi et al., "Quantum Computation by Adiabatic Evolution," MIT-CTP 2936, arXiv:quant-ph/0001106, pp. 1-24 (Jan. 2000).

Hastings, "Monte Carlo sampling methods using Markov chains and their applications," *Biometrika*, vol. 57, No. 1, pp. 97-109 (Apr. 1970).

Metropolis et al., "Equation of State Calculations by Fast Computing Machines," *The Journal of Chemical Physics*, vol. 21, No. 6, pp. 1087-1092 (Jun. 1953).

Somma et al., "Quantum Simulations of Classical Annealing Processes," *Physical Review Letters*, vol. 101, No. 13, pp. 1-4 (Sep. 2008).

Szegedy, "Quantum Speed-up of Markov Chain Based Algorithms," *IEEE Symp. on Foundations of Computer Science*, pp. 1-10 (Oct. 2004).

Babbush et al., "Encoding Electronic Spectra in Quantum Circuits with Linear T Complexity," *Physical Review X*, vol. 8, No. 4, 39 pp. (May 2018).

International Search Report and Written Opinion dated Dec. 18, 2019, from International Patent Application No. PCT/US2019/051968, 19 pp.

Krzakala et al., "On the path integral representation for quantum spin models and its application to the quantum cavity method and to Monte Carlo simulations," arXiv:0807.2553v2, 25 pp. (Jul. 2008).

Reitzner et al., "Quantum Walks," *Acta Physica Slovaca*, vol. 61, No. 6, pp. 603-725 (May 2013).

Temme et al., "Quantum Metropolis Sampling," arXiv:0911.3635v2, 32 pp. (Nov. 2009).

* cited by examiner

QUANTUM-WALK-BASED ALGORITHM FOR CLASSICAL OPTIMIZATION PROBLEMS

CROSS-REFERENCE TO RELATED APPLICATIONS

This application claims the benefit of U.S. Provisional Application No. 62/733,608 entitled "A QUANTUM-WALK-BASED ALGORITHM FOR CLASSICAL OPTIMIZATION PROBLEMS" and filed on Sep. 19, 2018, and claims the benefit of U.S. Provisional Application No. 62/865,300 entitled "QUANTUM-WALK-BASED ALGORITHM FOR CLASSICAL OPTIMIZATION PROBLEMS" and filed on Jun. 23, 2019, both of which are hereby incorporated herein in their entirety.

FIELD

This application concerns quantum computing.

SUMMARY

Figure 1:
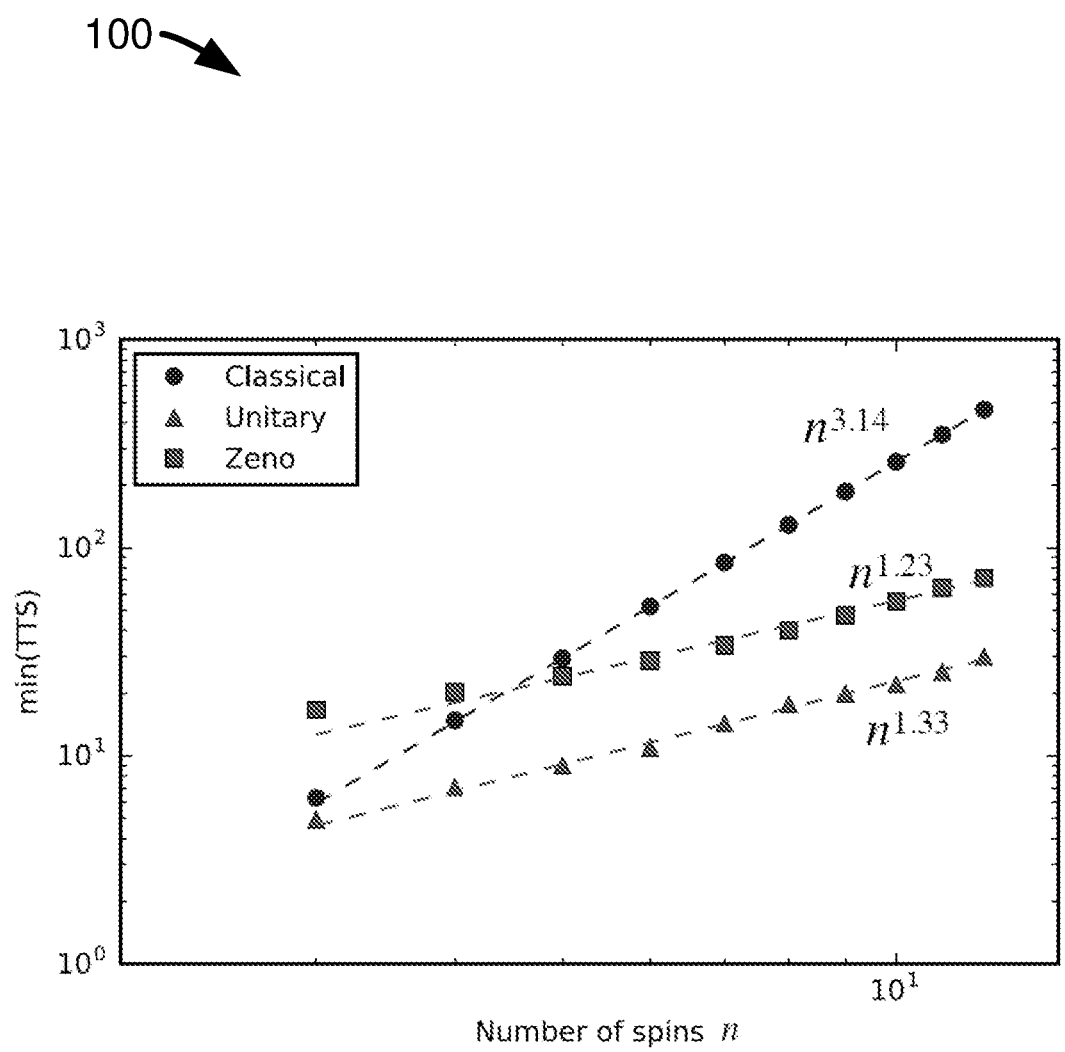
FIG. 1 is a graph showing an example minimum total time to solution (min(TTS)) as a function of system size for a one dimensional Ising model at $\beta=2$.

In this disclosure, example circuit implementations of Szegedy's quantization of the Metropolis-Hastings walk are presented. This quantum walk is usually defined with respect to an oracle. A direct implementation of this oracle requires costly arithmetic operations. As discussed herein, and in accordance with the disclosed technology, the quantum walk can be reformulated in a way that circumvents the problems of any previous approach. Also disclosed herein are heuristic quantum algorithms that, use the quantum walk in the context, of discrete optimization problems. Numerous studies of the resulting performances are also presented. The numerical results indicate polynomial quantum speedups in heuristic settings.

In certain disclosed embodiments, a quantum walk procedure of a Markov chain Monte Carlo simulation is implemented in which a quantum move register is reset, at every step in the quantum walk. In further embodiments, a quantum walk procedure of a Markov chain Monte Carlo simulation is implemented in which an underlying classical walk is obtained using a Metropolis-Hastings rotation or a Glauber dynamics rotation. In some embodiments, a quantum walk procedure is performed in the quantum computing device to implement a Markov Chain Monte Carlo method: during the quantum walk procedure, an intermediate measurement is obtained: and a rewinding procedure of one or more but not, all steps of the quantum walk procedure is performed if the intermediate measurement, produces an incorrect outcome.

Any of the disclosed embodiments can be performed by one or more computer-readable media storing computer-executable instructions which when executed by a computer cause the computer to perform any of the disclosed methods.

Any of the disclosed embodiments can also be implemented in a system, comprising a quantum computing device; and a classical computer in communication with and configured to control the quantum computing device, wherein the quantum computing device and the classical computer collectively operate to perform any of the disclosed methods.

DETAILED DESCRIPTION

I. Introduction

The disclosed technology involves the issue of accelerating Markov chain Monte Carlo (MCMC) simulations on a quantum computer using quantum walks. More generally, MCMC simulations are used in sampling from arbitrary distributions, Gibbs sampling, optimization, simulated annealing, and related methods. Quantum computers accelerate MCMC simulations by implementing them as quantum walks. In order to accomplish this acceleration, a Markov transition matrix is desirably implemented in embodiments of the disclosed technology as a walk oracle.

Embodiments of the disclosed technology concern the implementation of such oracles for accelerating MCMC algorithms in which the random walk might stay at the same location in one time step. Detailed example implementations of such oracles have heretofore been unknown. This disclosure presents examples that provide efficient ways to implement, such oracles. This allows for acceleration of MCMC simulations on quantum computers In some embodiments, a notable aspect of the technology is how to efficiently implement a quantum walk oracle of an MCMC algorithm to accelerate the random walk as a quantum walk. Choosing a random move in a quantum walk uses a random choice, which turns into a quantum move register in the quantum walk case. This quantum move register can be uncorrupted (reset) at every step in the quantum walk, which is not efficiently possible in previous naive solutions.

A further issue that, the disclosed technology addresses is a quantum walk for states where updates are rejected—that is, one stays in the original state. Previous solutions follow the original mathematical proposal and need to undo the proposed update in that case. In certain embodiments of the disclosed technology, however, this expensive step can be omitted by an operation controlled by a coin register in the case of rejected moves.

II. General Considerations

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

III. Example Embodiments

A. Introduction

Szegedy presented a general method to quantize reversible walks, resulting in a unitary transformation $U_W$ (See, e.g., M. Szegedy, in Proceedings of the 45th Annual IEEE Symposium on Foundations of Computer Science (2004).) The eigenvalues $e^{i\theta_j}$ of a unitary matrix lie on the unit complex circle. One can choose $\theta_0 \leq \theta_1 \leq \theta_2 \leq \ldots$. In this example, the steady state $|\pi\rangle$ of the quantum walk has $\theta_0=0$ and is essentially a coherent version $|\pi\rangle = \Sigma_x \sqrt{\pi_x} x\rangle$ of the classical equilibrium distribution n. One of the main features of the quantum walk is that its spectral gap $\delta := \theta_1 \geq \sqrt{\Delta}$ is quadratically larger than the one of the corresponding classical walk that would be $\Delta$. Combined to the quantum adiabatic algorithm, this yields a quantum algorithm to reach the steady state that scales quadratically faster with $\Delta$ than the classical MCMC algorithm. (See, e.g., E. Farhi, J. Goldstone. S. Gutmann, and M. Sipser, "Quantum computation by adiabatic evolution," (2000), quant-ph/0001106; D. Aharonov and A. Ta-Shma, Proc. 35th Annual ACM Symp, on Theo. Comp., 20 (2003); S. Boixo, E. Knill, and R. D. Somma, "Fast quantum algorithms for traversing paths of eigenstates," (2010), 1005.3034; S. Boixo, E. Knill, and R. D. Somma. "Fast. quantumn algorithms for traversing paths of eigenstates," (2010), 1005.3034.)

The time required to implement a single step $U_W$ of the quantum walk was traditionally large. With the disclosed technology, however, the time can be significantly reduced. Example quantum steps in accordance with the disclosed technology are shown as single steps W of the classical walk. With embodiments of the disclosed technology, quantum walks are more likely to offer advantages in situations with extremely long equilibration times. Moreover, classical walks are often used heuristically out of equilibrium. When training a neural network for instance, where a MCMC method called stochastic gradient is used to minimize a cost function, it is in practice often not necessary to reach the true minimum, and thus the MCMC runs in time less than its mixing time. Similarly, simulated annealing is typically used heuristically with a cooling schedule far faster than prescribed by provable bound. Such heuristic applications further motivate the constructions of efficient implementations of $U_W$, and the development of heuristic methods for quantum computers.

This disclosure addresses several points. For example, a detailed realization and cost analysis of the quantum walk operator is presented for the special case of a Metropolis-Hastings walk and a Glauber walk. There are widespread reversible walk, whose implementation only requires knowledge of the relative populations $\pi_x/\pi_y$, of the equilibrium distribution. While Szegedy's formulation of the quantum walk builds on a classical walk oracle, it requires costly arithmetic operations. In this disclosure, example embodiments are presented in which one can directly construct a related but different quantum unitary walk operator with substantially reduced circuit depth.

B. Preliminaries

1. Quantum Walk Test

A classical walk is defined on a d-dimensional state space $X = \{x\}$ by a $d \times d$ transition matrix $\mathcal{W}$ where the transition probability $x \to y$ is given by matrix element $\mathcal{W}_{yx}$. Thus, the walk maps the distribution $p_y$ to the distribution $p'_y = \Sigma_x \mathcal{W}_{yx} p_x$, or in matrix form $p' = \mathcal{W} p$. A walk is ergodic or irreducible if every state in X is accessible from every other state in X, which implies the existence of a unique equilibrium distribution $\pi = W\pi$. Finally, a walk is reversible if it obeys the detailed balance condition $$\mathcal{W}_{yx}\pi_x = \mathcal{W}_{xy}\pi_y. \tag{1}$$

One can now explain how to quantize an reversible classical walk $\mathcal{W}$.

Szegedy's quantum walk is formulated in an oracle setting. For a classical walk $\mathcal{W}$, it assumes a unitary transformation W acting on a Hilbert space $\mathbb{C}^d \otimes \mathbb{C}^d$ with the following action $$W|x\rangle \otimes |0\rangle = |w_x\rangle \otimes |x\rangle =: |\phi_x\rangle, \tag{2}$$

where $|w_x\rangle := \Sigma_y \sqrt{\mathcal{W}_{yx}}|y\rangle$. Define $\Pi_0$ the projector onto the subspace $\varepsilon_0$ spanned by states $\{|x\rangle \otimes |0\rangle\}_{x=1}^d$. Combining W to the reflection $R = 2\Pi_0 - 1$ and the swap operator $\Lambda$, one can construct the quantum walk defined by $$U_W := RW^\dagger \Lambda W \tag{3}$$

$$= (2\prod_0 - 1)W^\dagger \Lambda W. \tag{4}$$

Szegedy's walk is actually defined as $\Lambda W(RW^\dagger \Lambda W)RW^\dagger$, so it is essentially the square of the operator $U\mathcal{W}$ previously defined, but this will have no consequence on what follows aside from a minor simplification.

To analyze the quantum walk $U\mathcal{W}$, let one define the state $|\psi_x\rangle := \Lambda|\phi_x\rangle = |x\rangle|w_x\rangle$ and consider the operator $$X := \Pi_0 W^\dagger \Lambda W \Pi_0 \qquad (5)$$

$$= \sum_{xy} \langle \phi_y | \psi_x \rangle |y\rangle\langle x| \otimes |0\rangle\langle 0| \qquad (6)$$

$$= \sum_{xy} \sqrt{\mathcal{W}_{xy}\mathcal{W}_{yx}} |y\rangle\langle x| \otimes |0\rangle\langle 0|. \qquad (7)$$

At this point, it is assumed that the walk is reversible and makes use of the detailed balance condition Eq. (1) to obtain $$X = \sum_{xy} \sqrt{\frac{\pi_x}{\pi_y}} \mathcal{W}_{yx} |y\rangle\langle x| \otimes |0\rangle\langle 0|, \qquad (8)$$

or, if one restricts the operator X to its support $\varepsilon_0$, one gets in matrix notation $X = \mathrm{diag}(\pi^{-1/2}) \mathcal{W} \, \mathrm{diag}(\pi^{1/2})$. The matrices X and $\mathcal{W}$ are thus similar so they have the same eigenvalues. Define its eigenvectors $$X|\tilde{\gamma}_k\rangle = \lambda_k |\tilde{\gamma}_k\rangle, \qquad (9)$$

where $\lambda_k$ are the eigenvalues of W. Because the operator X is obtained by projecting the operator $W^\dagger \Lambda W$ onto the subspace $\varepsilon_0$, its eigenvectors with non-zero eigenvalues in the full Hilbert space clearly have the form $|\gamma_k\rangle = |\tilde{\gamma}_k\rangle \otimes |0\rangle$.

If one considers the action of $W^\dagger \Lambda W$ without those projections, one gets $$W^\dagger \Lambda W |\gamma_k\rangle = \lambda_k |\gamma_k\rangle - \beta_k |\gamma_k^\perp\rangle \qquad (10)$$

where $$|\gamma_k^\perp\rangle$$

is orthogonal to the subspace $\varepsilon_0$, so in particular it is orthogonal to all the vectors $|\gamma_{k'}\rangle$. Finally, because $W^\dagger \Lambda W$ is a unitary, one also obtains that the $$|\gamma_k^\perp\rangle$$

are orthogonal to each other and that $\beta_k = \sqrt{1-|\lambda_k|^2}$. This implies that the vectors $$\{|\gamma_k\rangle, |\gamma_k^\perp\rangle\}$$

are all mutually orthogonal and that $W^\dagger \Lambda W$ is block diagonal in that basis.

Given the above observations, it follows that $$U_\mathcal{W} |\gamma_k\rangle = \lambda_k |\gamma_k\rangle + \sqrt{1-|\lambda_k|^2} \, |\gamma_k^\perp\rangle \qquad (11)$$

$$U_\mathcal{W} |\gamma_k^\perp\rangle = \sqrt{1-|\lambda_k|^2} \, |\gamma_k\rangle - \lambda_k |\gamma_k^\perp\rangle, \qquad (12)$$

so the eigenvalues of $U_k$ on the subspace spanned by $$\{|\gamma_k\rangle, |\gamma_k^\perp\rangle\}$$

are $e^{\pm i\theta_k}$ where $\cos\theta_k = \lambda_k$ with corresponding eigenvectors $$|\gamma_k^\pm\rangle = \frac{1}{\sqrt{2}}(|\gamma_k\rangle \pm i|\gamma_k^\perp\rangle).$$

C. Adiabatic State Preparation

One can use quantum phase estimation to measure the eigenvalue of $U_\mathcal{W}$. In particular, it is desirable for the measurement to be sufficiently accurate to resolve the eigenvalue $\theta=0$, or equivalently $\lambda_k=1$, from the rest of the spectrum. Assuming that the initial state is supported on the subspace $\varepsilon_0$, the spectral gap of $U\mathcal{W}$ is $\delta=\theta_1=\arccos(\lambda_1)=\arccos(1-\Delta)\sim\sqrt{\Delta}$, so one only needs about $1/\sqrt{\Delta}$ applications of $U\mathcal{W}$ to realize that measurement. This is quadratically faster than the classical mixing-time $1/\Delta$, which is at the heart of the quadratic quantum speed up.

A measurement outcome corresponding to $\theta=0$ would produce the coherent stationary distribution $|\pi\rangle \otimes |0\rangle := \Sigma_x \sqrt{\pi_x} \otimes 0\rangle$. First note that for any $|\psi\rangle$ such that $X(|\psi\rangle \otimes |0\rangle|0\rangle)$, Eq. (10) implies that $U\mathcal{W}(|\psi\rangle|0\rangle) = |\psi\rangle \otimes |0\rangle$. One can verify that this condition holds for $|\psi\rangle = |\pi\rangle$:

$$X \sum_x \sqrt{\pi_x} |x\rangle \otimes |0\rangle = \sum_{xy} \sqrt{\frac{\pi_x}{\pi_y}} \mathcal{W}_{yx} \sqrt{\pi_y} |y\rangle \otimes |0\rangle \qquad (13)$$

$$= \sum_{xy} \mathcal{W}_{xy} \sqrt{\pi_y} |y\rangle \otimes |0\rangle \qquad (14)$$

$$= \sum_y \sqrt{\pi_y} |y\rangle \otimes |0\rangle \qquad (15)$$

where the detailed balance Eq. (1) has been used in the second step and $\Sigma_x \mathcal{W}_{xy}=1$ in the last step.

From an initial state $|\psi\rangle \otimes |0\rangle = \Sigma_k \alpha_k |\gamma_k\rangle$, the probability of that measurement outcome is $|\langle\psi|\pi\rangle|^2 = |\alpha_0|^2$, so the initial state $|\psi\rangle$ can be chosen with a large overlap with the fixed point to ensure that this measurement outcome has a non-negligible chance of success. If no such state can be efficiently prepared, one can use adiabatic state preparation to increase the success probability. In its discrete formulation inspired by the quantum Zeno effect, one can choose a sequence of random walks $\mathcal{W}^0, \mathcal{W}^1, \ldots \mathcal{W}^L = \mathcal{W}$ with coherent stationary distributions $|\pi^j\rangle$. The walks are chosen such that $|\pi^0\rangle$ is easy to prepare and consecutive walks are nearly identical, so that $$|\langle \pi^j | \pi^{j+1}\rangle|^2 \geq 1 - \frac{1}{L}.$$

Thus, the sequence of L measurements of the eigenstate of the corresponding quantum walk operators $U\mathcal{W}$, all yield the outcomes $\theta=0$ with probability $$\left(1 - \frac{1}{L}\right)^L \sim \frac{1}{e},$$

which results in the desired state. The overall complexity of this algorithm is $$C \sum_{j=1}^{L} \frac{1}{\delta_j} \qquad (16)$$

where $\delta_j$ is the spectral gap of the j-th quantized walk $\mathcal{W}^j$ and C is the time required to implement a single quantum walk operator.

D. Metropolis-Hastings Algorithm

The Metropolis-Hastings algorithm is a special class of Markov chains which obey detailed balance Eq. (1) by construction. The basic idea is to break the transition probability x→y into two steps. In a first step, a transition from x to y≠x is proposed with probability $T_{yx}$. This transition is accepted with probability $A_{yx}$, and if the transition is rejected the state remains x. The overall transition probability is thus $$W_{yx} = \begin{cases} T_{yx} A_{yx} & \text{if } y \neq x \\ 1 - \sum_y T_{yx} A_{yx} & \text{if } y = x. \end{cases} \qquad (17)$$

The detailed balance condition Eq. (1) becomes $$R_{xy} := \frac{A_{yx}}{A_{xy}} = \frac{\pi_y}{\pi_x} \frac{T_{xy}}{T_{yx}}, \qquad (18)$$

which in the Metropolis-Hastings algorithm is solved with the choice $$A_{yx} = \min(1, R_{xy}). \qquad (19)$$

One can note that the quantum algorithm can also be applied to the Glauber, or heat-bath, choice $$A_{yx} = \frac{1}{1 + R_{yx}}. \qquad (20)$$

The Metropolis-Hastings algorithm is widely used to generate a Boltzmann distribution as used in statistical physics and machine learning. Given a real energy function E(x) on the configuration space X, the Boltzmann distribution at inverse temperature β is defined as $$\pi_x^\beta = \frac{1}{Z(\beta)} e^{-\beta E(x)}$$

where the partition function Z(β) ensures normalization. In this setting, it is common practice to choose a symmetrical proposed transition $T_{yx} = T_{xy}$, so the acceptance probability depends on the energy difference $$A_{yx} = \min(1, e^{\beta[E(x) - E(y)]}). \qquad (21)$$

E. Circuit for Walk Operator

Quantum algorithms built from quanizatiation of classical walks usually assume an oracle formulation of the walk operator, where the ability to implement the transformation W of Eq. (2) is taken for granted. As is discussed below, this transformation requires costly arithmetic operations. One of the many innovations in this disclosure is to provide a detailed and simplified implementation of a walk operator along with a detailed cost analysis for Metropolis-Hastings walks. Some example embodiments of the disclosed technology circumvent the use of W altogether.

For concreteness, it will be assumed that a (k,d)-local Ising model, where $X = \{+1, -1\}^n$, and the energy function takes a simple form $$E(x) = \sum_\ell J_\ell \prod_{s \in \Omega_\ell} x_s \qquad (22)$$

where $\Omega^\ell$ are subsets of at most k Ising spins and the $J^\ell$ are real coupling constants, and each spin interacts with at most d other spins.

As is the case for Ising models, it will be assumed that the proposed transition of the Metropolis-Hastings walk is obtained by choosing a random set of spins and inverting their signs. In other words. $T_{yx} = f(x \cdot y)$ where the product is taken bit, by bit and where $f(z)$ is a probability distribution on $X - \{1^n\}$ (it does not contain a trivial move), so $T_{yx}$ is symmetrical. The distribution $f(z)$ is sparse, in the sense that it has only $N \ll 2^n$ non-zero entries.

It will be supposed that $f$ is uniform over some set M of moves, with $|\mathcal{M}| = N$:

$$T_{xy} = \begin{cases} \frac{1}{N} & \text{if } z = x \cdot y \in \mathcal{M} \\ 0 & \text{else} \end{cases} \qquad (23)$$

One example comprises single-spin moves, where a single spin is chosen uniformly at random to be flipped. More generally, it will be supposed that moves are sparse in the sense that each move $z_j \in \mathcal{M}$ flips a constant-bounded number of spins and that each spin belongs to a constant-bounded number of different moves $z_j \in \mathcal{M}$. For j=1, 2, ..., N, one can use $f(j)$ as a shorthand for $f(z_j)$ where the $z_j$ are the N elements of $\mathcal{M}$. Here, $z_j \in \mathcal{M}$ will be viewed as both as Ising spin configurations and as subsets of [n], where the correspondence is given by the locations of −1 spins in $z_j$.

Because a direct implementation of the oracle W generally relies on costly quantum circuits realizing arithmetic operations, certain example embodiments of the disclosed technology do not implement W, but instead present circuits that are isometric to the entire walk operator $U_\mathcal{W}$. In particular implementations, example circuits are presented for $\tilde{U}_\mathcal{W} := Y^\dagger U_\mathcal{W} Y$ where Y maps $$Y : |x\rangle \otimes |y\rangle \to \begin{cases} |x\rangle \otimes |x \cdot y\rangle & \text{if } x \cdot y \in \mathcal{M} \\ 0 & \text{else.} \end{cases} \qquad (24)$$

To reduce circuit depth, the second register above can be encoded in a unary representation, so it, contains N qubits and $|z\rangle$ is encoded as $|00 \ldots 0100 \ldots \rangle$ with a 1 at the z-th position. In addition to these two registers, the circuit acts on an additional coin qubit. For purposes of illustration, the System, Move, and Coin registers will be denoted with the corresponding subscripts $|x\rangle_S|z\rangle_M|b\rangle_C$, and they contain n, N. and 1 qubits respectively.

Example implementation of the walk operator combine 4 components:

$$\tilde{U}_W = RV^\dagger B^\dagger FBV \quad (25)$$

TABLE I

| Gate | 3L depth | 3L count | Total depth | Qubits |
|---|---|---|---|---|
| V | $\log_2 N + 1$ | $2N$ | $\log_2 N + 1$ | $2N$ |
| F | 1 | N | $\log_2 N + 1$ | $2N + n$ |
| R | $2 \log N$ | $4N$ | $2\log N$ | $2N$ |
| B | $\mathcal{O}\left(2^d \log \frac{1}{\epsilon}\right)$ | $\mathcal{O}\left(N 2^d \log \frac{1}{\epsilon}\right)$ | $\mathcal{O}\left(\log N 2^d \log \frac{1}{\epsilon}\right)$ | $2N + n + 2$ |

Upper bound on the complexity of each components the walk operator. The cost is measured in terms of number of gates in the 3rd level of the Clifford hierarchy, which is equivalent to T count up to a small multiplicative factor. These are evaluated for a (k, d)-local Ising model with moves comprising single-spin flips, in which case N = n. These costs could otherwise increase by a constant amount determined by k, d and the sparsity of the moves $z \in M$.

where $$V : |0\rangle_M \rightarrow \sum_j \sqrt{f(j)} |j\rangle_M, \quad (26)$$

$$B : |x\rangle_S|j\rangle_M|0\rangle_C \rightarrow |x\rangle_S|j\rangle_M\left(\sqrt{1 - A_{x \cdot z_j \cdot x}} |0\rangle + A_{x \cdot z_j \cdot x}|1\rangle\right)_C, \quad (27)$$

$$F : |x\rangle_S|j\rangle_M|b\rangle_C \rightarrow |x \cdot z_j^b\rangle_S|j\rangle_M|b\rangle_C, \text{ and} \quad (28)$$

$$R : |0\rangle_M|0\rangle_C \rightarrow -|0\rangle_M|0\rangle_C, |j\rangle_M|b\rangle \rightarrow |j\rangle_M|b\rangle \text{ for } (j, b) \neq (0, 0) \quad (29)$$

It can be verified that these realize the desired walk operator. The following paragraphs provide a more complete description of each of these components, and their complexity is summarized at Table I.

1. Move Preparation V

Recall that the Move register is encoded in unary. Here, the focus is on the case of a uniform distribution. To begin, suppose that N is a power of 2. Starting in the state $|000 \ldots 01\rangle_M$, the state $$\frac{1}{\sqrt{N}} \sum_j |j\rangle_M$$

(in unary) is obtained by applying a sequence of N gates $\sqrt{SWAP}$ in a binary-tree fashion. Recall that $$\sqrt{SWAP}|10\rangle = \frac{1}{\sqrt{2}}(|01\rangle + |10\rangle).$$

The gate $\sqrt{SWAP}$ is in the third level of the Clifford hierarchy, so it can be implemented using a constant number of T gates. This represents a substantial savings.

To avoid such costly rotations, even when N is not a power of 2, one can choose to pad the distribution with additional states and prepare a distribution $$\frac{1}{2^f} \sum_j^{2^f} |j\rangle_M$$

where $f = \lceil \log_2 N \rceil$. The states $j = 1, 2, \ldots N$ encode the N moves $\mathcal{M}$ of the classical walk $x \rightarrow y = x \cdot z_j$, while the additional states $j > N$ correspond to trivial moves $x \rightarrow x$. This padding has the effect of slowing down the classical walk by a factor $2^f/N < 2$, and hence the quantum walk by a factor less than $\sqrt{2}$, which is less than the additional cost, of preparing a uniform distribution over a range which is not a power of 2.

2. Spin Flip F

The operator F of Eq. (28) flips a set of system spins $z_j$ conditioned on the j-th qubit of the move register being in state 1. This can be implemented with at most Nc Toffoli gates (control-control-not), where the constant c upper-bounds the number of spins that are flipped by a single move of $\mathcal{M}$. The coin register acts as one control for each gate, the j-th bit of the move register acts as the other control, and the targets are the system register qubits that are in $z_j$, for $j=1, 2, \ldots N$. No gate is applied to the padding qubits $j > N$.

This implementation is sequential, but can also be performed in parallel. In particular, one example implementation uses $\mathcal{O}(N)$ additional scratchpad qubits but is parallel. In such implementations, the sparsity of the moves M can be considered, and (generally speaking) there is a tradeoff between the scratchpad size and the circuit depth. When the moves comprise single-spin flips, for example, this uses N CNOTs in a binary-tree fashion (depth $\log_2 N$) to make N copies of the coin qubit. The Toffoli gates can then be applied in parallel for each move, and lastly the CNOTs are undone.

3. Reflection R

The transformation R of Eq. (29) is a reflection about the state $|00 \ldots 0\rangle_M|0\rangle_C$. Using standard phase kickback methods, it can be implemented with a single additional qubit in state $$\frac{1}{\sqrt{2}}(|0\rangle - |1\rangle)$$

and a control$^{(N+1)}$-not gate. The latter cart be realized from 4(N−1) serial Toffoli gates and linear depth.

In this disclosure, improved example circuit layouts are presented. In some examples, for instance, circuits that use at most N ancillary qubits and 4N Toffoli gates to realize the (N+1)-fold controlled-not. The circuit once again proceeds in a binary tree fashion, dividing the set of N+1 qubits into (N+1)/2 pairs and applying a Toffoli gate between every pair with a fresh ancilla in state 0 as the target. The ancillary associated to a given pair is in state 0 if and only if both qubits of the pair are in state 0. The procedure is repeated to the (N+1)/2 ancillary qubits, until a single bit indicates if all qubits are in state 0. The ancillary bits are then uncomputed.

4. Boltzmann Coin B

The Boltzmann coin Eq. (27) is an expensive component of the algorithm. In more detail, the Boltzmann coin is a component that desirably uses rotations of arbitrary angles. For example, conditioned on move qubit j being 1 and the system register being in state r, the coin register undergoes a rotation by an angle $$\theta_{x,j} = \arcsin(\sqrt{\min\{e^{-\beta \Delta_j(x)}, 1\}}) \quad (30)$$

for Metropolis-Hastings or $$\theta_{x,y} = \arcsin\left(\sqrt{\frac{1}{1+e^{\beta \Delta_j(x)}}}\right) \quad (31)$$

for Glauber dynamics, where $\Delta_k = E(x \cdot z_j) - E(x)$. Given the sparsity constraints of the function E and of the moves $z_j \in \mathcal{M}$, the quantity $\Delta_j$ can be evaluated from a subset of qubits of the system register, namely $\mathcal{N} = \{k: k \in \Omega_l \& z_j \cap \Omega_l \neq \emptyset, \forall l\}$. For single-spin flips on a (k,d)-local Hamiltonian, $|\mathcal{N}| \leq d$ by definition. For multi-spin flips $z_j$, one can achieve $|\mathcal{N}| \leq |z_j| d$.

Thus, in such embodiments, the Boltzmann coin comprises a sequence of N conditional gates $R_j$, where $R_j$ itself is a single-qubit rotation by an angle determined by the qubits in the set $\mathcal{N}$.

By contrast, example embodiments of the disclosed technology employ a new approach. Since each $\mathcal{N}$ are of constant-bounded sizes, and in accordance with example embodiments of the disclosed technology, each $R_j$ can be realized from a constant number of T gates, so the entire Boltzmann coin can require $$\mathcal{O}\left(N \log \frac{1}{\epsilon}\right)$$

T gates, where ε is the desired accuracy. In certain examples, because gates $R_j$ act, on the Coin register, they are applied sequentially. An alternative to this comprises copying the coin register in the conjugate basis $\sigma_y$, i.e. $|\pm i\rangle \rightarrow |\pm i\rangle^{\otimes N}$ since a sequence of rotations $e^{i\theta_j \sigma_x}$ is equivalent to a tensor product of these rotation under this mapping. Moreover, any set of gates $R_j$ with non-overlapping $\mathcal{N}$ can be executed in parallel, so the total depth can be bounded by a constant at the expense of N additional qubits.

The complexity of the Boltzmann coin does scale exponentially with the sparsity parameters of the model—namely as $\mathcal{O}(\max_j 2^{\mathcal{N}_j})$. A circuit that achieves $R_j$ comprises a sequence of $2^{|\mathcal{N}_j|}$ single-qubit rotations by angle given by Eq. (30) or Eq. (31), conditioned on the bits in $\mathcal{N}$ taking some fixed value. These $2^{|\mathcal{N}_j|}$ multi-controlled rotations typically use $\mathcal{O}(|\mathcal{N}|)$ Toffoli gates along with $$\mathcal{O}\left(\log \frac{1}{\epsilon}\right)$$

T gates, for an overall circuit depth of $$\mathcal{O}\left(2^{|\mathcal{N}_j|} |\mathcal{N}_j| \log \frac{1}{\epsilon}\right)$$

to realize $R_j$.

Another efficient way to realize the Boltzmann coin uses quantum signal processing methods. This is a method to constructs a unitary transformation $S_2 = \Sigma_x f(e^{i\Phi_x})|x\rangle\langle x|$ from a controlled version of $S_1 = \Sigma_x e^{i\Phi_x}|x\rangle\langle x|$. In the current setting, $S_1 = \Sigma_x e^{i\lambda \Delta_j(x)}|x\rangle\langle x|$ and one can choose $f(e^{i\lambda \Delta_j(x)}) = e^{i2\theta_{x,y}}$ where $\theta_{x,j}$ is given at Eq. (30). Applying a Hadamard to the Coin qubit, followed by a controlled $S_2$ with the Coin acting as control, and followed by a Hadamard on the Coin qubit again results in the transformation that we called $R_j$ above and that, build up the Boltzmann coin transformation B.

Above, the constant λ is chosen in such a way that the argument of the exponential $e^{i\lambda \Delta_j(x)}$ is restricted to some finite interval which does not span the entire unit circle, say in the range $[-\pi/2, \pi/2]$. The exponential can be further decomposed as a product $$e^{i\lambda \Delta_j(x)} = \prod_{\lambda: \Omega_\ell \cap z_j \neq \emptyset} \exp\left\{i\lambda 2 J_\ell \prod_{s \in \Omega_\ell} x_s\right\}. \quad (32)$$

Each of these components comprises a rotation by an angle $2J_l$, whose sign is conditioned on the parity of the bits in $\Omega_l$. The parity bit can be computed using $|\Omega_l|$ CNOTs, and the rotation is implemented using gate synthesis, with a T-gate count per transformation of $$\mathcal{O}\left(\log \frac{1}{\epsilon}\right),$$

which is dictated by the accuracy $\epsilon$. The complexity of quantum signal processing depends on the targeted accuracy. More precisely, it scales with the number of Fourier coefficients required to approximate the function $f(e^{i\theta}) = \min(1, e^{-\theta\beta/\lambda})$ or $$g(e^{i\theta}) = \frac{1}{1+e^{\theta\beta/\lambda}}$$

to some constant accuracy on the domain $\theta \in [-\pi/2, \pi/2]$.

F. Heuristic Use

The Metropolis-Hastings algorithm is widely used heuristically to solve minimization problems using simulated annealing or related algorithms. The objective function is the energy E(x). Starting from a random configuration or an informed guess, the random walk is applied until some low-energy configuration x is reached. The parameter β can be varied in time, with an initial low value enabling large energy fluctuations to prevent the algorithm from getting trapped in local minimums, and large final value to reach a good (perhaps local) minimum.

In this section, example heuristics that use the quantum walk in the context of a minimization problem are introduced.

In certain example embodiments, schedules with a linearly increasing value of β in time are used up to a fixed final value of β.

1. Total Time to Solution

When a random walk is used to minimize some function E(x), the minimum x* is typically reached with some finite probability p. Starting from some distribution q(x) and applying the walk $\mathcal{W}$ sequentially t times, the success probability is $p(t)=(\mathcal{W}^t q)(x^*)$. To boost this probability to some constant value $1-\delta$, it is helpful to repeat the procedure $$L = \frac{\log(1-\delta)}{\log(1-p(t))}$$

times. The total time to solution can then be defined as the duration of the walk t times the number of repetitions L, In general, compromises can be reached between the duration of the walk t and the success probability $p(t)$— longer walks can reach a higher success probability and therefore be repeated fewer times, but increasing the duration t of the walk beyond a certain point has a negligible impact on its success probability $p(t)$. Accordingly, and in some instances, one can define the minimum total time to solution as $\min(TTS)=\min_t TTS(t)$.

2. Zeno with Rewind

In zeno, it was explained how to prepare the eigenstate of $U\mathcal{W}$ with eigenvalue 1 using a sequence of walks $\mathcal{W}^0, \mathcal{W}^1, \ldots, \mathcal{W}^L = \mathcal{W}$. In the setting of Metropolis-Hastings where $\mathcal{W}$ is the walk with parameter $\beta$, a natural choice of $\mathcal{W}^j$ are given by $$\beta^j = \frac{j}{L}\beta.$$

An optimized $\beta$ schedule is also possible, but for a systematic comparison with the classical walk, one can choose this fixed schedule, whose only parameter is the number of steps L.

Revisiting the argument of zeno it is helpful to establish some notation. Define the binary projective measurement $$\{Q_j, Q_j^\perp\} := \{|\pi^j\rangle\langle\pi^j|, I - |\pi^j\rangle\langle\pi^j|\}.$$

This binary measurement can be realized from $$\frac{1}{\delta_j}$$

uses of $U\mathcal{W}^j$, where $\delta_j$ denotes the spectral gap of $U\mathcal{W}^j$. Starting from the state $|\pi^0\rangle$, the Zeno algorithm comprises performing the sequence of binary measurements $\{Q_j, Q_j^\perp\}$ in increasing value of j. The outcome $Q_j$ on state $|\pi^{j-1}\rangle$ yields state $|\pi^j\rangle$ and occurs with probability $F_j^2 := |\langle\pi^{j-1}|\pi^j\rangle|^2$. The sequence of measurements succeeds if they all yield this outcome, which occurs with probability $\Pi_{j=1}^L F_j^2$ and requires $$\sum_{j=1}^L \frac{1}{\delta_j}$$

applications of quantum walk operator. For the algorithm to be successful, the final measurement in the computational basis also yields the optimal outcome $x^*$, which occurs with probability $\pi^L(x^*)$. Thus, the total time to solution for an the L-step algorithm is $$TTS(L) = \frac{\log(1-\delta)}{\log\left(1-\pi^L(x^*)\prod_{j=1}^L F_j^2\right)} \sum_{j=1}^L \frac{1}{\delta_j}. \quad (33)$$

In the method outlined above, a measurement outcome $Q_j^\perp$ involves a complete restart of the algorithm to $\beta=0$. There exists an alternative to a complete restart, termed a "rewind". It comprises iterating between the measurements $$\{Q_{j-1}, Q_{j-1}^+\} \text{ and } \{Q_j, Q_j^+\}$$

until the measurement $Q_j$ is obtained. It can be shown that a transition between outcomes $Q_{j-1} \leftrightarrow Q_j$ or $$Q_{j-1}^+ \leftrightarrow Q_j^+$$

is $F_j^2$ while the probability of a transition between outcomes $Q_{j-1}\perp \leftrightarrow Q_j$ or $$Q_{j-1} \leftrightarrow Q_j^+$$

is $1-F_j^2$. Given the cost $$\frac{1}{\delta_j}$$

of each of these measurements, one can obtain a simple recursion relation for the expected cost of a successful $|\pi^{j-1}\rangle \to |\pi^j\rangle$ transition with rewind, and thus for the total time to solution for a L-Zeno protocol with rewind. The minimal total time to solution is obtained by minimizing over L. Rewinding yields substantial savings compared to the regular Zeno strategy for the preparation of quantum many-body ground states.

3. Unitary Implementation

In this section, a heuristic use of the quantum walk that does not use measurement is disclosed. Starting from state $|\pi^0\rangle$, this embodiment comprises applying the quantum walk operators $U\mathcal{W}^j$, sequentially, resulting in the state $$|\psi(L)\rangle = U_{\mathcal{W}^L} \ldots U_{\mathcal{W}^2} U_{\mathcal{W}^1} |\pi^0\rangle \quad (34)$$

and ending with a computational basis measurement. The algorithm is successful if a computational basis measurement yields the outcome $x^*$ on state $|\psi(L)\rangle$ (rewind could be used otherwise), so the total time to solution for the L-step algorithm is $$TTS(L) = \frac{\log(1-\delta)}{\log(1-|\langle x^*|U_{\mathcal{W}^L} \ldots U_{\mathcal{W}^2} U_{\mathcal{W}^1}|\pi^0\rangle|^2)}. \quad (35)$$

In S. Boixo, E. Knill, and R. D. Sonmma, "Fast quantum algorithms for traversing paths of eigenstates," (2010), 1005.303-1, a protocol was proposed where each unitary was applied a random number of times. The motivation for these randomized transformations was to phase randomize in the eigenbasis of the instantaneous unitary operator. When the spectral gap of a unitary operator is δ and that unitary is applied a random number of times in the interval $$\left[0, \frac{1}{\delta_j}\right],$$

then the relative phase between the eigenstate with eigenvalue 1 and the other eigenstates is randomized over the unit circle, thus mimicking the effect of a measurement (but with an unknown outcome). From this analogy, one could expect that the unitary implementation yields a minimal total time to solution roughly equal to the Zeno-based algorithm with no rewind. But as will be shown in the next section, its behavior is much better than anticipated—this method is more efficient than the Zeno algorithm with rewind, which itself is more efficient than Zeno without rewind.

4. Numerical Results

Three heuristic algorithms were numerically benchmarked: the classical walk with a variable-length linear interpolation between β=0 and β=2 and starting from a uniform distribution; the discrete, or Zeno-based adiabatic algorithm with rewind: and the unitary algorithm of the last subsection. The first system considered is a one dimensional Ising model. FIG. 1 shows the minimal total time to solution as a function of system size. In particular, FIG. 1 is a graph 100 that shows the minimum total time to solution (min (TTS)) as a function of system size for a one dimensional Ising model at β=2.

The results clearly indicate a polynomial advantages of the quantum algorithms over the classical algorithm. Surprisingly, the improvement exceeds the expected quadratic improvement, with a power law fit, going from 3.14 in the classical setting to 1.33 in the quantum setting using the unitary algorithm and 1.23 using the Zeno algorithm.

The second system considered is a sparse random Ising model: it has with gaussian random couplings $J_j$ of variance 1 and $\Omega_j$ comprises a random subset of 3.5n of all the n(n−1)/2 pairs of sites.

Figure 2:
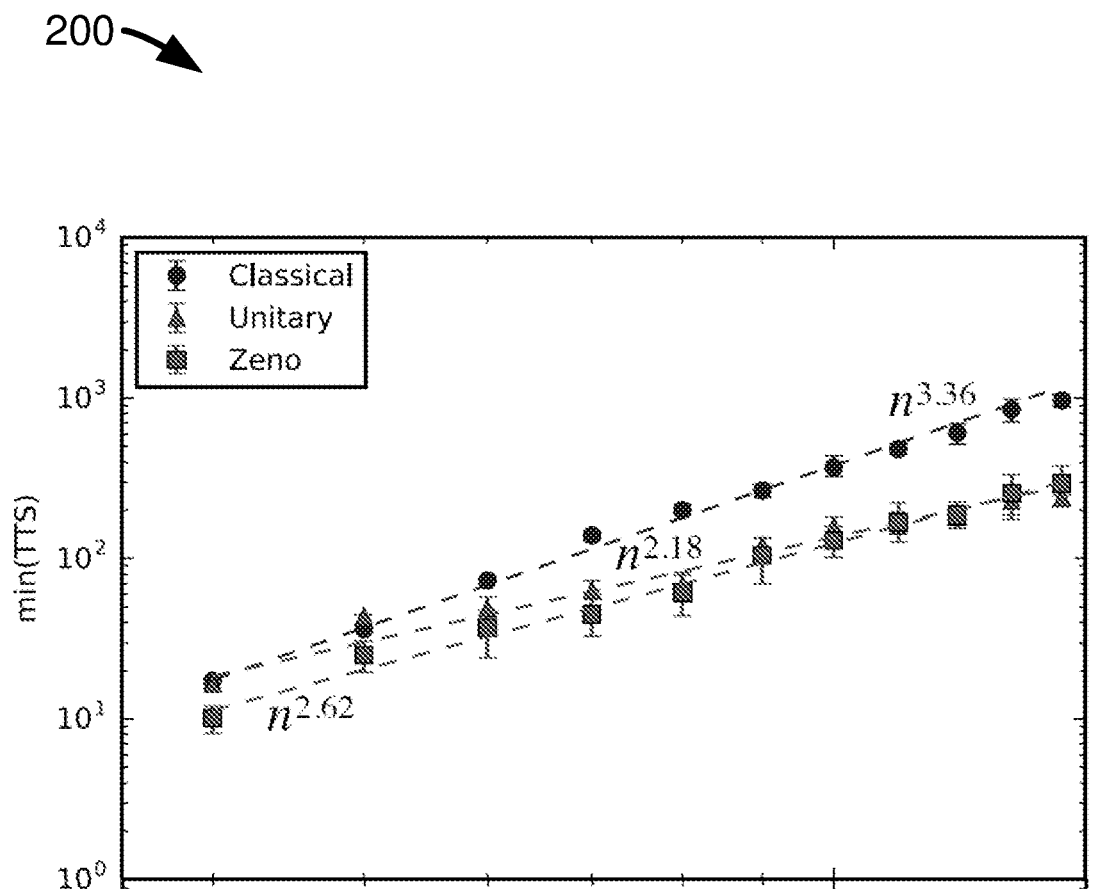
FIGS. 2 and 3 are a series of graphs showing an example minimum total time to solution (min(TTS)) as a function of system size for a sample of 100 random instances of the Ising model; in particular, graph 200 of FIG. 2 shows the median TTS in the illustrated example, and graph 300 of FIG. 3 illustrates the average of 10% of the hardest example instances relative to the classical walk.
Figure 3:
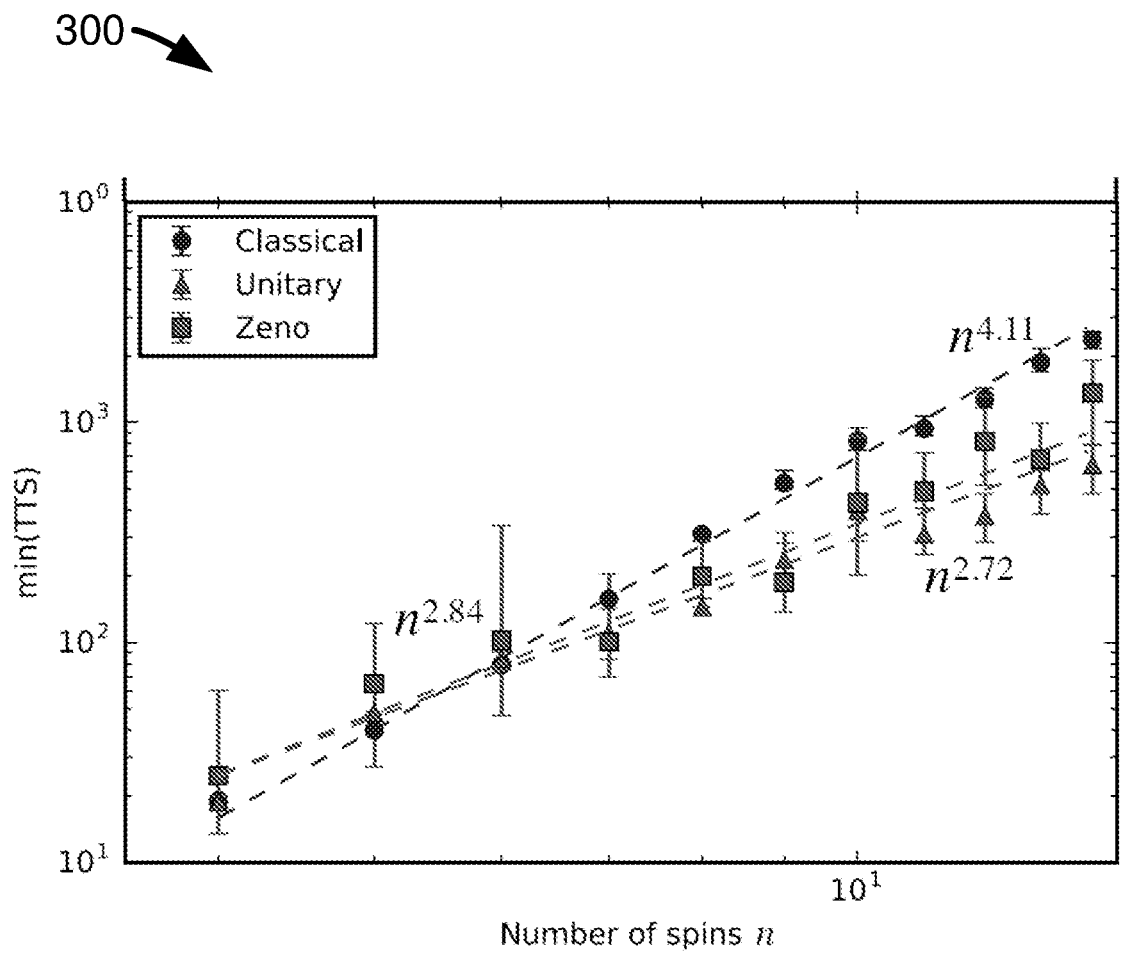

FIGS. 2 and 3 are graphs 200, 300, respectively that show minimum total time to solution as a function of the system size n, for a random ensemble of 100 systems of each sizes. In particular, the graphs 100 and 200 of FIGS. 2 and 3 show the minimum total time to solution (min(TTS)) as a function of system size for a sample of 100 random instances of the Ising model. Fits are obtained by least-mean-square. FIG. 2 shows the median TTS, whereas FIG. 3 shows the average of 10% hardest instances relative to the classical walk. All error bars are obtained from the bootstrap method and show a 95% confidence interval. Fit parameters are given at Table II.

In other words, FIGS. 2 and 3 show the median min(TTS) as well as the hardest 10-percentile, where hardness is defined with respect to the classical algorithm. In all cases, the results indicate a polynomial advantage of the quantum methods over the classical method, but these advantages are much less pronounced than for the 1D Ising model.

In both the one-dimensional and the random graph Ising model, the unitary quantum algorithm achieves at least similar but often superior scalings than the Zeno with rewind algorithm.

5. Cost Analysis and Simplifications

First, the cost of gate V used to prepare the Move register will be analyzed. One of the most favorable cases to consider for the quantum oracle is when the proposed transitions $f(z)$ comprises all possible single-spin flips. In that

TABLE II

Fit parameters a and b used in FIGS. 2 and 3 of the form min (TTS) = an$^b$. Error bars are obtained from the bootstrap method.

| Method | a | b |
|---|---|---|
| Classical median | 0.17 ± 0.01 | 3.36 ± 0.04 |
| Unitary median | 0.9 ± 0.1 | 2.18 ± 0.07 |
| Zeno median | 0.3 ± 0.1 | 2.62 ± 0.2 |
| Classical 10 centile | 0.053 ± 0.005 | 4.11 ± 0.04 |
| Unitary 10 centile | 0.57 ± 0.07 | 2.72 ± 0.07 |
| Zeno 10 centile | 1 ± 2 | 2.84 ± 0.7 | case, the move register is desirably prepared in a uniform superposition $$\frac{1}{\sqrt{n}}\sum_{i=1}^{n}|i\rangle. \tag{36}$$

Assuming further that $n=2^k$ is a power of 2, the Move register can be prepared in the binary representation from k Hadamard gates acting in parallel on k qubits initialized to 10). In the unary representation, the state of the Move register can be prepared using n gates $\sqrt{\Lambda}$ acting sequentially on n qubits. The cost of applying a proposed transition to the Right register conditioned on the state of the Move register. When n is not a power of 2, one can use simple padding where all states i=n+1, n+2, . . . $2^k$ encode the trivial move. At worst, this will slow-down the walk by a factor of 2.

Note that both operations described above use a number of elementary operations that scales with the system size, even though they are implementing a single step of the quantum walk and that on average, a single spin is modified per step of the walk. This contrasts with the classical walk. Indeed, when implementing a single step of the classical walk operator $\mathcal{W}$, a spin transition x→x·z is chosen with probability $f(z)$, the acceptance probability is computed, and the move is either accepted or rejected. Each transition x→x·z typically involve only a few spins (one in the setting that is being currently considering), so implementing such a transition in the classical walk does not require al extensive number of gates. The complexity in that case is actually dominated by the generation of a pseudo-random number selecting the location of the spin to be flipped.

The last item which determines the cost is the Boltzmann coin operation B. It is helpful to note that this operation is applied in quantum parallelism to all the proposed transitions, so its complexity is independent of the system size in contrast to the transformation V. A constituent of the Boltzmann coin transformation is the transformation G that evaluates the energy E(x) of a configuration x. This operation is required by both classical and quantum walks, so their cost should be relatively equal. Note that one does not need the energy of a configuration E(x) directly, but more accurately, one only needs to compute the energy difference of two configurations $E(x)-E(x \cdot z)$. When the proposed transitions z only affects a few spins and the Ising model is sparse, e.g. when the interactions ranges $\Omega_l$ are restricted to constant-radius balls on the lattice, these calculations can be greatly simplified.

So the main cost of the Boltzmann coin B stems from the conditional rotation by angle $\theta=2 \arcsin(e^{\beta E}/2)$. This can be implemented either using a hard wired circuit, whose complexity scales exponentially with the number of bits representing E, or using a Taylor series of the function $\theta=2 \arcsin(\epsilon^{\beta E}/2)$ along with elementary controlled rotations. This cost should be compared to the classical cost of generating a random bit with probability $e^{\beta E}$. Again, additional simplifications are possible in special cases, e.g. when the parameter $J_l$ of the model Eq. (22) are restricted to a discrete set.

IV. Example Computing Environments

Figure 4:
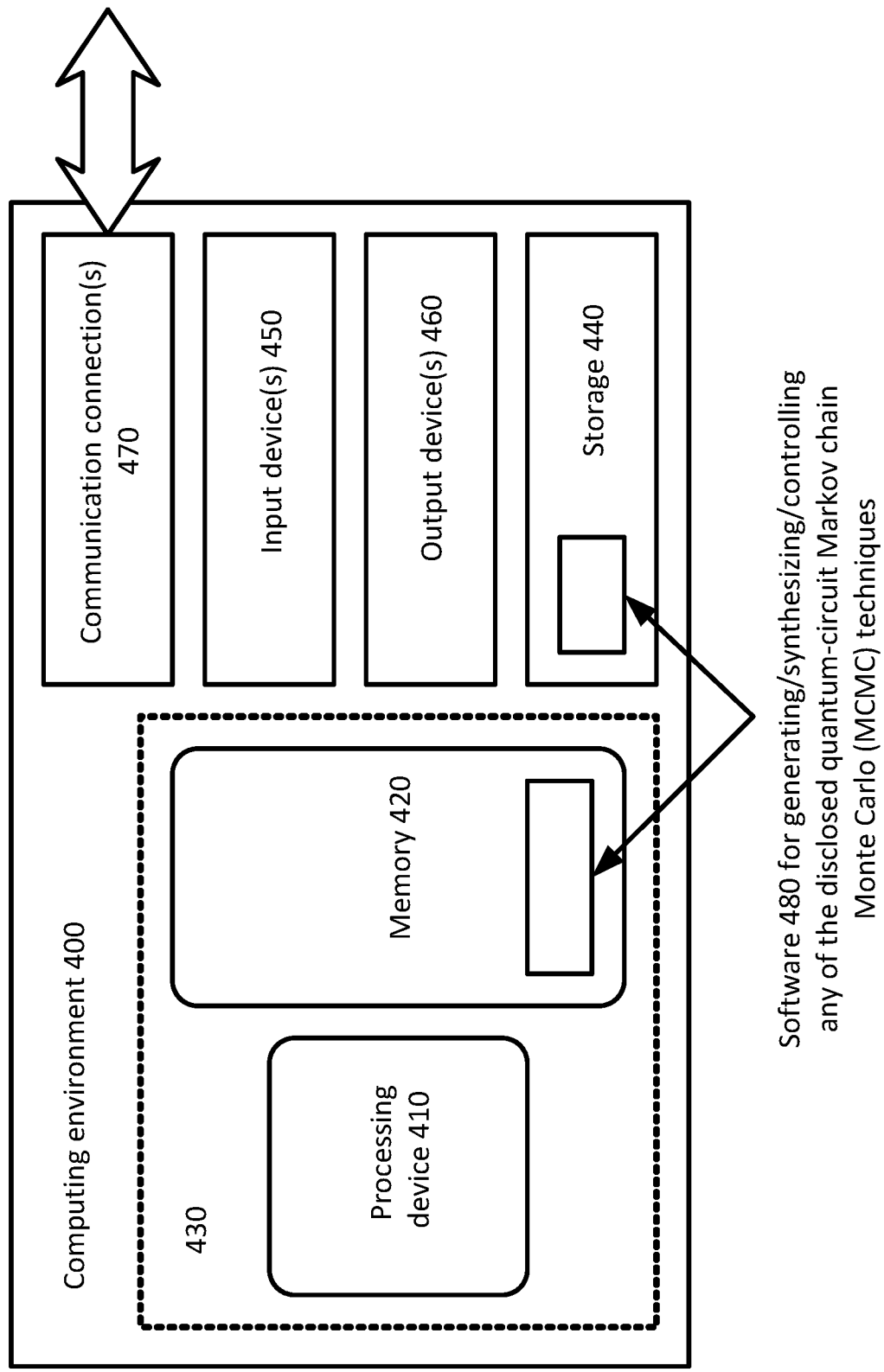
FIG. 4 illustrates a generalized example of a suitable classical computing environment in which several of the described embodiments can be implemented.

FIG. 4 illustrates a generalized example of a suitable classical computing environment 400 in which several of the described embodiments can be implemented. The computing environment 400 is not intended to suggest any limitation as to the scope of use or functionality of the disclosed technology, as the techniques and tools described herein can be implemented in diverse general-purpose or special-purpose environments that have computing hardware.

With reference to FIG. 4, the computing environment 400 includes at least one processing device 410 and memory 420. In FIG. 4, this most basic configuration 430 is included within a dashed line. The processing device 410 (e.g., a CPU or microprocessor) executes computer-executable instructions. In a multi-processing system, multiple processing devices execute computer-executable instructions to increase processing power. The memory 420 may be volatile memory (e.g., registers, cache, RAM, DRAM, SRAM), non-volatile memory (e.g., ROM, EEPROM, flash memory), or some combination of the two. The memory 420 stores software 480 implementing tools for generating/synthesizing/controlling any of the disclosed quantum-circuit Markov chain Monte Carlo (MCMC) techniques as described herein. The memory 420 can also store software 480 for synthesizing, generating, or compiling quantum circuits for implementing any of the MCMC techniques as described herein.

The computing environment can have additional features. For example, the computing environment 400 includes storage 440, one or more input devices 450, one or more output devices 460, and one or more communication connections 470. An interconnection mechanism (not shown), such as a bus, controller, or network, interconnects the components of the computing environment 400. Typically, operating system software (not shown) provides an operating environment for other software executing in the computing environment 400, and coordinates activities of the components of the computing environment 400.

The storage 440 can be removable or non-removable, and includes one or more magnetic disks (e.g., hard drives), solid state drives (e.g., flash drives), magnetic tapes or cassettes. CD-ROMs, DVDs, or any other tangible non-volatile storage medium which can be used to store information and which can be accessed within the computing environment 400. The storage 440 can also store instructions for the software 480 implementing any of the disclosed MCMC techniques. The storage 440 can also store instructions for the software 480 for generating and/or synthesizing any of the described techniques, systems, or reversible circuits.

The input device(s) 450 can be a touch input device such as a keyboard, touchscreen, mouse, pen, trackball, a voice input device, a scanning device, or another device that provides input to the computing environment 400. The output device(s) 460 can be a display device (e.g., a computer monitor, laptop display, smartphone display, tablet display, netbook display, or touchscreen), printer, speaker, or another device that provides output, from the computing environment 400.

The communication connection(s) 470 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, MCMC techniques, circuit design techniques, or compilation/synthesis techniques can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 420 and/or storage 440, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 5:
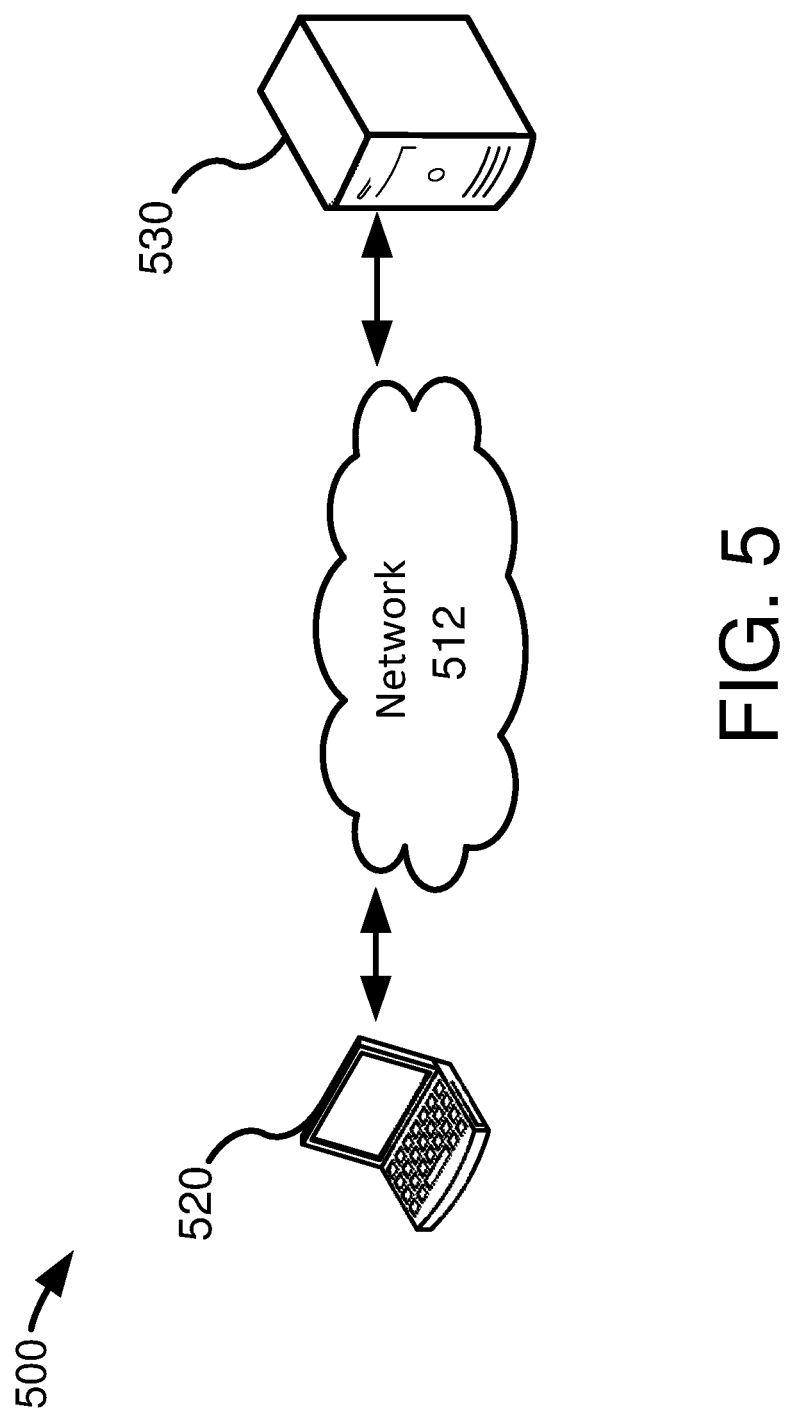
FIG. 5 illustrates an example of a possible network topology (e.g., a client-server network) for implementing a system according to the disclosed technology.

An example of a possible network topology 500 (e.g., a client-server network) for implementing a system according to the disclosed technology is depicted in FIG. 5. Networked computing device 520 can be, for example, a computer running a browser or other software connected to a network 512. The computing device 520 can have a computer architecture as shown in FIG. 5 and discussed above. The computing device 520 is not limited to a traditional personal computer but can comprise other computing hardware configured to connect to and communicate with a network 512 (e.g., smart phones, laptop computers, tablet computers, or other mobile computing devices, servers, network devices, dedicated devices, and the like). Further, the computing device 520 can comprise an FPGA or other programmable logic device. In the illustrated embodiment, the computing device 520 is configured to communicate with a computing device 530 (e.g., a remote server, such as a server in a cloud computing environment) via a network 512. In the illustrated embodiment, the computing device 520 is configured to transmit input, data to the computing device 530, and the computing device 534) is configured to implement an MCMC technique according to any of the disclosed embodiments and/or a circuit generation or compilation/synthesis methods for generating quantum circuits based on or in conjunction with any of the MCMC techniques disclosed herein. The computing device 530 can output results to the computing device 5320. Any of the data received from the computing device 530 can be stored or displayed on the computing device 520 (e.g., displayed as data on a graphical user interface or web page at, the computing devices 520). In the illustrated embodiment, the illustrated network 512 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g. or 802.11n or other appropriate standard). Alternatively, at least part of the network 812 can be the Internet or a similar public network and operate using an appropriate protocol (e.g., the HTTP protocol).

Figure 6:
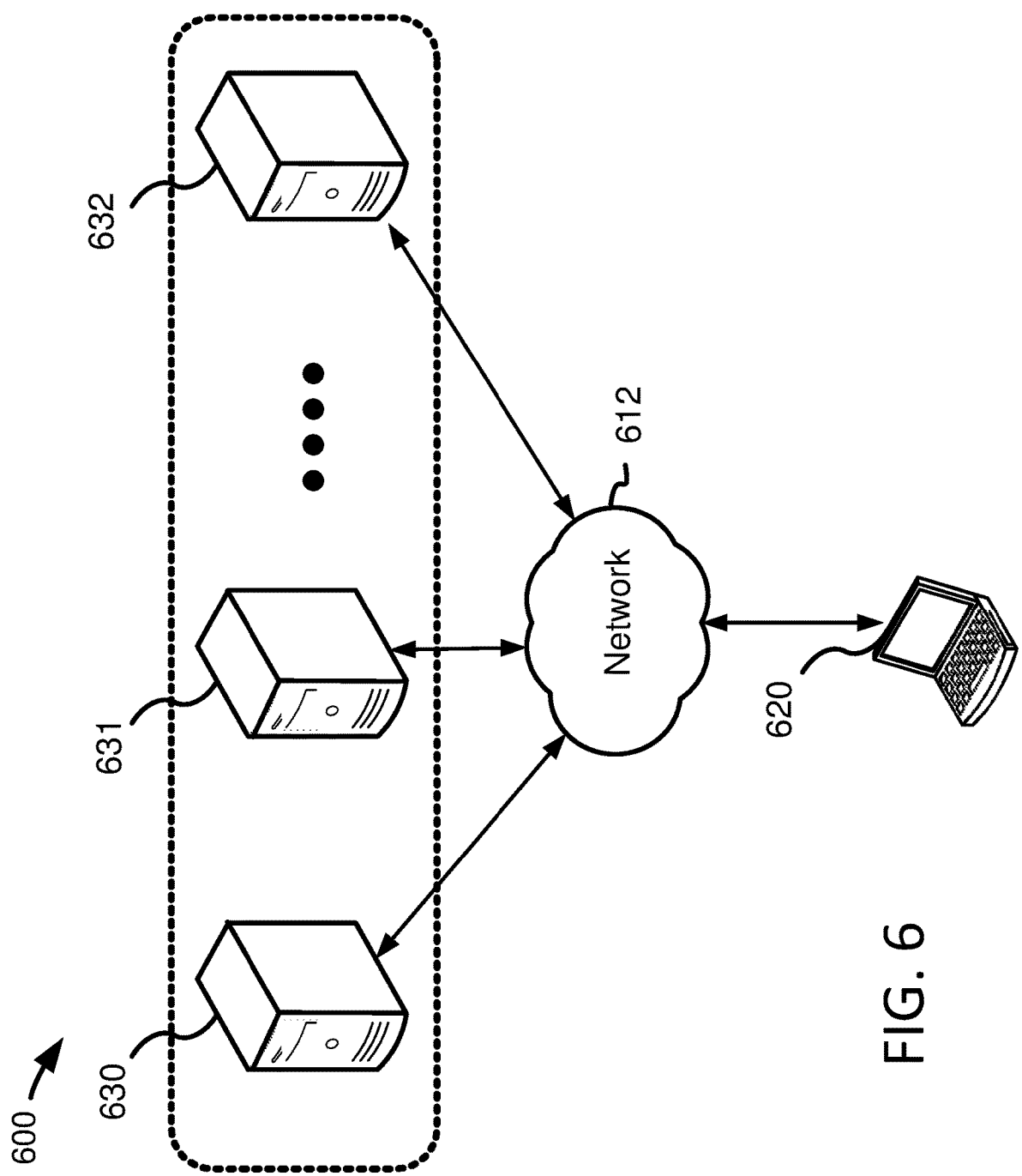
FIG. 6 illustrates another example of a possible network topology (e.g., a distributed computing environment) for implementing a system according to the disclosed technology.

Another example of a possible network topology 600 (e.g., a distributed computing environment) for implementing a system according to the disclosed technology is depicted in FIG. 6. Networked computing device 620 can be, for example, a computer running a browser or other software connected to a network 612. The computing device 620 can have a computer architecture as shown in FIG. 5 and discussed above. In the illustrated embodiment, the computing device 620 is configured to communicate with multiple computing devices 630, 631, 632 (e.g., remote servers or other distributed computing devices, such as one or more servers in a cloud computing environment) via the network 612. In the illustrated embodiment, each of the computing devices 630, 631, 632 in the computing environment 600 is used to perform at least a portion of an MCMC process and/or circuit generation or synthesis/compilation process. In other words, the computing devices 630, 631, 632 form a distributed computing environment in which the MCMC process and/or generation/compilation/synthesis processes are shared across multi pile computing devices. The computing device 620 is configured to transmit input data to the computing devices 630, 631, 632, which are configured to distributively implement such as process, including performance of any of the disclosed methods or creation of any of the disclosed circuits, and to provide results to the computing device 620. Any of the data received from the computing devices 630, 631, 632 can be stored or displayed on the computing device 620 (e.g., displayed as data on a graphical user interface or web page at, the computing devices 621)). The illustrated network 612 can be any of the networks discussed above with respect to FIG. 5.

Figure 7:
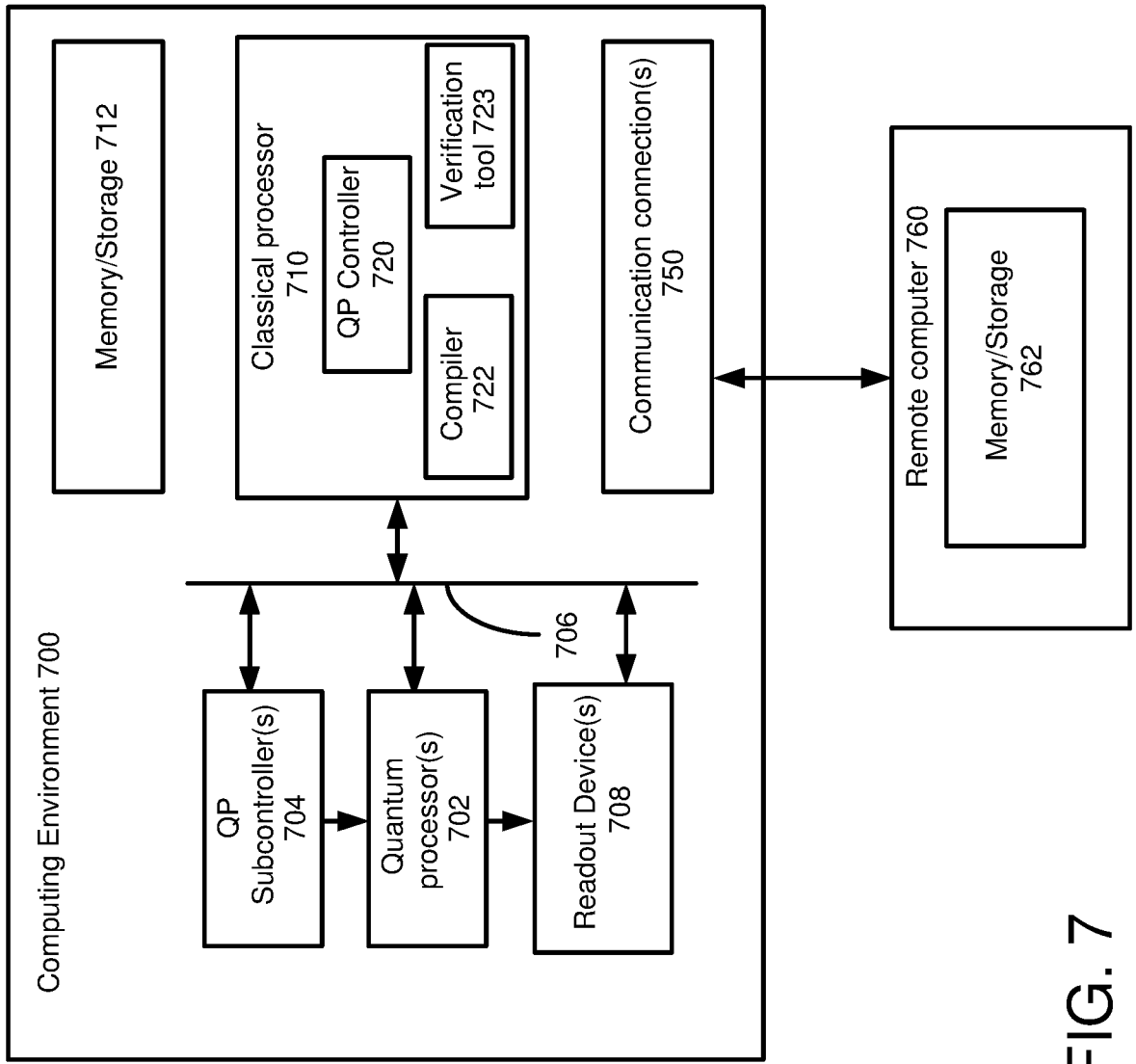
FIG. 7 illustrates an exemplary system for implementing the disclosed technology.

With reference to FIG. 7, an exemplary system for implementing the disclosed technology includes computing environment 700. In computing environment 700, a compiled quantum computer circuit description (including quantum circuits for performing any of the MCMC techniques as disclosed herein) can be used to program (or configure) one or more quantum processing units such that the quantum processing unit(s) implement the circuit described by the quantum computer circuit description.

The environment 700 includes one or more quantum processing units 702 and one or more readout device(s) 708. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing: and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 706 at the control of quantum processor controller 721). The quantum processor controller (QP controller) 720 can operate in conjunction with a classical processor 710 (e.g., having an architecture as described above with respect to FIG. 4) to implement the desired quantum computing process. In the illustrated example, the QP controller 720 further implements the desired quantum computing process via one or more QP subcontrollers 704 that are specially adapted to control a corresponding one of the quantum processor(s) 702. For instance, in one example, the quantum controller 720 facilitates implementation of the compiled quantum circuit by sending instructions to one or more memories (e.g., lower-temperature memories), which then pass the instructions to low-temperature control unit(s) (e.g., QP subcontroller(s) 704) that transmit, for instance, pulse sequences representing the gates to the quantum processing unit(s) 702 for implementation. In other examples, the QP controller(s) 720 and QP subcontroller(s) 704 operate to provide appropriate magnetic fields, encoded operations, or other such control signals to the quantum processor(s) to implement the operations of the compiled quantum computer circuit description. The quantum controller(s) can further interact with readout devices 708 to help control and implement the desired quantum computing process (e.g., by reading or measuring out data results from the quantum processing units once available, etc.)

With reference to FIG. 7, compilation is the process of translating a high-level description of a quantum algorithm into a quantum computer circuit description comprising a sequence of quantum operations or gates, which can include the circuits as disclosed herein. The compilation can be performed by a compiler 722 using a classical processor 710 (e.g., as shown in FIG. 4) of the environment 700 which loads the high-level description from memory or storage devices 712 and stores the resulting quantum computer circuit description in the memory or storage devices 712.

In other embodiments, compilation and/or verification can be performed remotely by a remote computer 760 (e.g., a computer having a computing environment as described above with respect to FIG. 4) which stores the resulting quantum computer circuit description in one or more memory or storage devices 762 and transmits the quantum computer circuit description to the computing environment 700 for implementation in the quantum processing unit(s) 702. Still further, the remote computer 700 can store the high-level description in the memory or storage devices 762 and transmit the high-level description to the computing environment 700 for compilation and use with the quantum processor(s). In any of these scenarios, results from the computation performed by the quantum processor(s) can be communicated to the remote computer after and/or during the computation process. Still further, the remote computer can communicate with the QP controller(s) 720 such that the quantum computing process (including any compilation, verification, and QP control procedures) can be remotely controlled by the remote computer 760. In general, the remote computer 760 communicates with the QP controller(s) 720, compiler/synthesizer 722, and/or verification tool 723 via communication connections 750.

In particular embodiments, the environment 700 can be a cloud computing environment, which provides the quantum processing resources of the environment 500 to one or more remote computers (such as remote computer 760) over a suitable network (which can include the internet).

V. Further Example Embodiments

Figure 8:
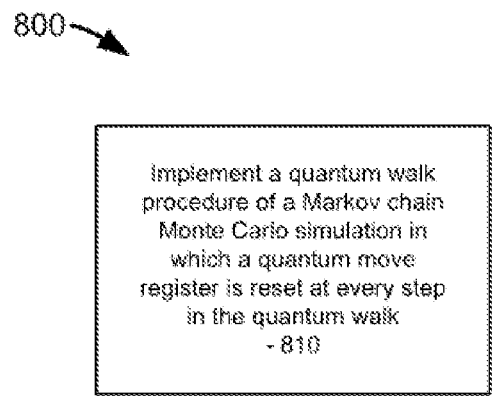
FIG. 8 is a flow chart illustrating one example method for performing an embodiment of the disclosed advancements in quantum computing.

FIG. 8 illustrates a method of 800 operating a quantum computing device in accordance with the disclosed technology. At 810, a quantum walk procedure of a Markov chain Monte Carlo simulation is implemented in which a quantum move register is reset at every step in the quantum walk. In certain implementations, the quantum walk procedure is performed without a measurement. In further implementations, the quantum walk procedure is performed using binary encodings of the move registers. In some implementations, the quantum walk procedure is performed using unary encodings of the move registers.

Figure 9:
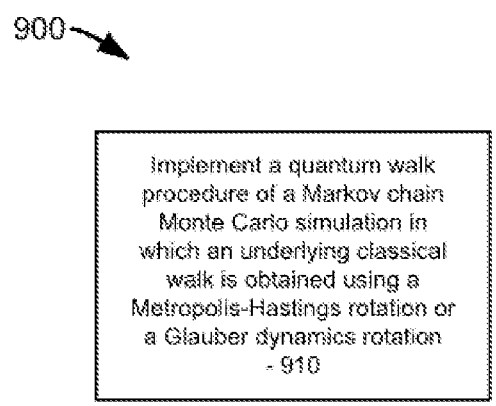
FIG. 9 is a flow chart illustrating another example method for performing an embodiment of the disclosed advancements in quantum computing.

FIG. 9 illustrates a method 900 of operating a quantum computing device in accordance with the disclosed technology. At 910, a quantum walk procedure of a Markov chain Monte Carlo simulation is implemented in which an underlying classical walk is obtained using a Metropolis-Hastings rotation or a Glauber dynamics rotation.

In some implementations, the method comprises any one or more of:
preparing a move register in a uniform superposition of all bit locations $$|\phi\rangle_M = \frac{1}{\sqrt{N}} \sum_{j=1}^{N} |j\rangle_M;$$

copying the state of the left register onto the right register, resulting in $$|\phi\rangle_M \otimes |x\rangle_L \otimes |x\rangle_R;$$

conditioned on the state of the move register, flipping the j-th bit, of the left register:

$$\sum_y \sqrt{T_{yx}} |j\rangle_M \otimes |y^j\rangle_L \otimes |x\rangle_R,$$

where $y^j$ is x with the j-th bit, flipped;
using the left and right registers to evaluate $A_{xy}$ and prepare a coin register in state $\sqrt{A_{yx}}|0\rangle_C + \sqrt{1-A_{yx}}|1\rangle_C$;
uncomputing the move register by looking up the coordinate where the left and right registers differ; and
implementing the transformation $$\sum_y \sqrt{T_{yx}(1-A_{yx})} |y\rangle_L \otimes |x\rangle_R \otimes |1\rangle_C \rightarrow \sqrt{1 - \sum_y T_{yx} A_{yx}} |x\rangle_L \otimes |x\rangle_R \otimes |0\rangle_C.$$

In further implementations, the quantum walk procedure comprises any one or more of:

$\tilde{U}\mathcal{W} = RV^\dagger B^\dagger FBV$ where, V: $-0\rangle_M \rightarrow \Sigma_j \sqrt{f(j)} |j\rangle_M$,
B: $-x\rangle_S |j\rangle_M |0\rangle_C \rightarrow |x\rangle_S |j\rangle_M (\sqrt{1-A_{x \cdot z_j x}} |0\rangle + A_{x \cdot z_j x} |1\rangle)_C$,
F: $-x\rangle_S |j\rangle_M |b\rangle_C \rightarrow |x \cdot z_j^b\rangle_S |j\rangle_M |b\rangle_C$, and
R: $-0\rangle_M |0\rangle_C \rightarrow -|0\rangle_M |0\rangle_C$, $|j\rangle_M |b\rangle \rightarrow |j\rangle_M |b\rangle$ for $(j,b) \neq (0,0)$ In certain implementations, the quantum walk procedure is performed with only a logarithmic depth. In some implementations, the quantum walk procedure is performed using binary encodings of the move registers. In certain implementations, the quantum walk procedure is performed using unary encodings of the move registers. In certain implementations, the quantum walk procedure is performed using a Boltzmann coin having a coin register that is rotated using the Metropolis-Hastings rotation. In some implementations, the quantum walk procedure is performed using a Boltzmann coin having a coin register that is rotated using the Glauber dynamics rotation. In certain implementations, the quantum walk procedure comprises implementing a Boltzman coin using lookup tables and conditional quantum gates.

Figure 10:
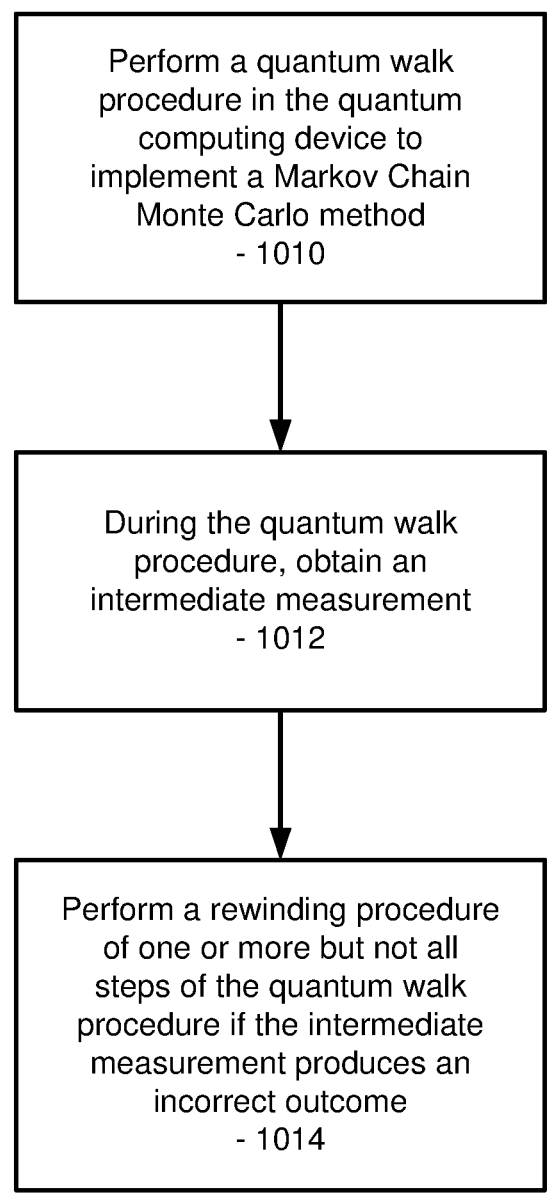
FIG. 10 is a flow chart illustrating a further example method for performing an embodiment of the disclosed advancements in quantum computing.

FIG. 10 is another flow chart 1000 illustrating a method of operating a quantum computing device in accordance with the disclosed technology. The particular operations and sequence of operations should not be construed as limiting, as they can be performed alone or in any combination, subcombination, and/or sequence with one another. Additionally, the illustrated operations can be performed together with one or more other operations.

At 1010, a quantum walk procedure is performed in the quantum computing device to implement a Markov Chain Monte Carlo method.

At 1012, (luring the quantum walk procedure, an intermediate measurement is obtained.

At 1014, a rewinding procedure of one or more but not all steps of the quantum walk procedure is performed if the intermediate measurement produces an incorrect outcome.

In certain implementations, the rewinding procedure comprises rewinding only a single step of the quantum walk procedure. In some implementations, the rewinding procedure is performed using a pair of binary projective measurements.

Any of the disclosed embodiments can be performed by one or more computer-readable media storing computer-executable instructions which when executed by a computer cause the computer to perform any of the disclosed methods.

Any of the disclosed embodiments can also be implemented in a system, comprising a quantum computing device; and a classical computer in communication with and configured to control the quantum computing device, wherein the quantum computing device and the classical computer collectively operate to perform any of the disclosed methods.

VI. Concluding Remarks

Having described and illustrated the principles of the disclosed technology with reference to the illustrated embodiments, it will be recognized that the illustrated embodiments can be modified in arrangement, and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

The invention claimed is:

1. A method of operating a quantum computing device, comprising:
   implementing a quantum walk procedure of a Markov chain Monte Carlo simulation in which an underlying classical walk is obtained using a Metropolis-Hastings rotation or a Glauber dynamics rotation, wherein the method comprises any one or more of:
   preparing a move register in a uniform superposition of all bit locations $$|\phi\rangle_M = \frac{1}{\sqrt{N}} \sum_{j=1}^{N} |j\rangle_M;$$

copying the state of the left register onto the right register, resulting in $$|\phi\rangle_M \otimes |x\rangle_L \otimes |x\rangle_R;$$

conditioned on the state of the move register, flipping the j-th bit of the left register:

$$\sum_y \sqrt{T_{yx}} |j\rangle_M \otimes |y^j\rangle_L \otimes |x\rangle_R,$$

where $y^j$ is x with the j-th bit flipped;
   using the left and right registers to evaluate $A_{xy}$ and prepare a coin register in state $$\sqrt{A_{yx}}|0\rangle_C + \sqrt{1-A_{yx}}|1\rangle_C;$$

uncomputing the move register by looking up the coordinate where the left and right registers differ; and implementing the transformation $$\sum_y \sqrt{T_{yx}(1-A_{yx})} |y\rangle_L \otimes |x\rangle_R \otimes |1\rangle_C \to \sqrt{1-\sum_y T_{yx}A_{yx}} |x\rangle_L \otimes |x\rangle_R \otimes |0\rangle_C.$$

wherein $T_{yz}$ represents a transition of a Metropolis-Hastings walk, N represents a number of qubits, j represents a qubit, $|\phi\rangle_M$ is a state of a move register, $|x\rangle_L$ is a state of a left register, $|x\rangle_R$ is a state of a right register, $A_{yx}$ is a minimum energy difference, defined as $A_{yx}=\min(1, e^{\beta[E(x)-E(y)]})$, wherein $\beta$ is inverse temperature, $|j\rangle_M$ corresponds to a $j_{th}$ qubit of the move register, $|y^j\rangle_L$ corresponds to a $j_{th}$ qubit of the left register, and C denotes the coin register.

2. The method of claim 1, wherein the quantum walk procedure is performed using binary encodings of the move registers.

3. The method of claim 1, wherein the quantum walk procedure is performed using unary encodings of the move registers.

4. A method of operating a quantum computing device, comprising: implementing a quantum walk procedure of a Markov chain Monte Carlo simulation in which an underlying classical walk is obtained using a Metropolis-Hastings rotation or a Glauber dynamics rotation, wherein the quantum walk procedure is performed with only a logarithmic depth and follows:

$$\tilde{U}_W = RV^\dagger B^\dagger FBV,$$

wherein f(j) is $f(z_j)$, wherein $z_j$ is one of N elements of a set of moves M $$V \to \sum_j \sqrt{f(j)} |j\rangle_M,$$

$$B \to |x^j\rangle_S |j\rangle_M (\sqrt{1-A_{x \cdot z_j}} |0\rangle + A_{x \cdot z_j} |1\rangle)_C,$$

$$F \to |x \cdot z_j^b\rangle_S |j\rangle_M |b\rangle_C,$$

$$R \to -|0\rangle_M |0\rangle_C, \text{ and } |j\rangle_M |b\rangle \to |j\rangle_M |b\rangle$$
   for $(j,b) \neq (0,0)$, $U_W$ represents a quantum walk, V represents a move preparation, F represents a spin flip, R represents a reflection and B represents a Boltzmann coin.

5. A method of operating a quantum computing device, comprising:
   implementing a quantum walk procedure of a Markov chain Monte Carlo simulation in which an underlying classical walk is obtained using a Metropolis-Hastings rotation or a Glauber dynamics rotation, wherein the quantum walk procedure is performed using a Boltzmann coin having a coin register that is rotated using the Metropolis-Hastings rotation.

6. A method of operating a quantum computing device, comprising:
   implementing a quantum walk procedure of a Markov chain Monte Carlo simulation in which an underlying classical walk is obtained using a Metropolis-Hastings rotation or a Glauber dynamics rotation, wherein the quantum walk procedure is performed using a Boltzmann coin having a coin register that is rotated using the Glauber dynamics rotation.

7. A method of operating a quantum computing device, comprising:
   implementing a quantum walk procedure of a Markov chain Monte Carlo simulation in which an underlying classical walk is obtained using a Metropolis-Hastings rotation or a Glauber dynamics rotation, wherein the quantum walk procedure comprises implementing a Boltzmann coin using lookup tables and conditional quantum gates.

* * * * *